(12) United States Patent
Sharma

(10) Patent No.: US 10,530,320 B2
(45) Date of Patent: Jan. 7, 2020

(54) ATTENUATOR DE-QING LOSS IMPROVEMENT AND PHASE BALANCE

(71) Applicant: pSemi Corporation, San Diego, CA (US)

(72) Inventor: Vikas Sharma, Reading (GB)

(73) Assignee: pSemi Corporation, San Diego, CA (US)

( * ) Notice: Subject to any disclaimer, the term of this patent is extended or adjusted under 35 U.S.C. 154(b) by 22 days.

(21) Appl. No.: 15/212,025

(22) Filed: Jul. 15, 2016

(65) Prior Publication Data

US 2018/0019721 A1  Jan. 18, 2018

(51) Int. Cl.
*H03H 7/03* (2006.01)
*H03H 7/06* (2006.01)

(52) U.S. Cl.
CPC .............. *H03H 7/03* (2013.01); *H03H 7/06* (2013.01)

(58) Field of Classification Search
CPC ............. H03K 5/1252; H03K 19/0036; H03K 19/00361; H03H 7/03; H03H 7/06; H03H 7/12; H03H 11/0422; H03H 11/0127; H03H 11/04; H03H 11/1291; H03H 11/1269; H03H 19/004
See application file for complete search history.

(56) References Cited

U.S. PATENT DOCUMENTS

| | | | |
|---|---|---|---|
| 4,902,983 A | 2/1990 | Fujiki et al. | |
| 5,109,204 A | 4/1992 | Keefer | |
| 5,281,928 A * | 1/1994 | Ravid | H03H 11/245 327/308 |
| 5,349,312 A | 9/1994 | Huettner et al. | |
| 5,477,200 A | 12/1995 | Ono | |
| 5,568,105 A | 10/1996 | O'Leary et al. | |
| 5,666,089 A | 9/1997 | Ehlers | |
| 5,811,961 A | 9/1998 | Daughters | |
| 6,326,843 B1 | 12/2001 | Nygren et al. | |
| 6,727,767 B2 | 4/2004 | Takada | |
| 6,876,271 B2 | 4/2005 | Evers et al. | |
| 7,420,416 B2 | 9/2008 | Persson et al. | |
| 7,839,233 B2 * | 11/2010 | Zhao | H01P 1/22 327/308 |

(Continued)

FOREIGN PATENT DOCUMENTS

WO    2018013207    1/2018

OTHER PUBLICATIONS

Vergoosen, Joannes, International Search Report and Written Opinion received from the EPO dated Aug. 21, 2017 for appln. No. PCT/US2017/032283, 5 pgs.

(Continued)

*Primary Examiner* — An T Luu
(74) *Attorney, Agent, or Firm* — Jaquez Land Greenhaus LLP; Alessandro Steinfl, Esq.

(57) ABSTRACT

The de-Qing loss and phase imbalance caused by the inherent capacitance of a switched resistance, such as a MOSFET with a resistor, can be reduced by using a shunting switch across the resistor that is in series with the resistor's switch. The shunting switch shorts across the resistor when the resistor's switch is open and in reference mode, thereby significantly reducing the resistance in series with the inherent capacitance of the open resistor's switch.

24 Claims, 15 Drawing Sheets

(56) References Cited

U.S. PATENT DOCUMENTS

2014/0049312 A1     2/2014   Chih-Sheng
2018/0019722 A1     1/2018   Birkbeck

OTHER PUBLICATIONS

Takaoka, Dean O., Office Action received from the USPTO dated Dec. 19, 2017 for U.S. Appl. No. 15/212,046, 35 pgs.

Peregrine Semiconductor Corporation, Response filed in the USPTO dated Feb. 21, 2018 for U.S. Appl. No. 15/212,046, 15 pgs.

De La Pinta, Luis, Written Opinion of the International Preliminary Examining Authority received from the EPO dated Jun. 19, 2018 for appln. No. PCT/US2017/032283, 6 pgs.

Takaoka, Dean O., Office Action received from the USPTO dated May 17, 2018 for U.S. Appl. No. 15/212,046, 27 pgs.

Takaoka, Dean O., Notice of Allowance received from the USPTO dated Nov. 1, 2018 for U.S. Appl. No. 15/212,046, 19 pgs.

De La Pinta, Luis, International Preliminary Report on Patentability received from the EPO dated Oct. 22, 2018 for appln. No. PCT/US2017/032283, 9 pgs.

\* cited by examiner

ATTENUATOR DE-QING LOSS IMPROVEMENT AND PHASE BALANCE

CROSS REFERENCE TO RELATED APPLICATIONS

The present application may be related to U.S. patent application Ser. No. 15/212,046, filed on even date, entitled "Hybrid Coupler with Phase and Attenuation Control" and assigned to the assignee of the present disclosure, the contents of which are hereby incorporated by reference in their entirety.

TECHNICAL FIELD

Various embodiments described herein relate generally to systems, methods, and apparatus for improving de-Qing loss and phase balance for attenuator circuits.

BACKGROUND

Various devices can be switched between a reference mode and an attenuated mode by the use of a switched parallel resistance. For example, a Pi-pad attenuator can include transistors on the legs of the Pi-pad to turn on and off each of the legs from an "attenuation mode" (switched on) to a "reference mode" or "floating mode" (switched off). Ideally, with the transistor turned on the input signal only sees the parallel resistance at the node and with the transistor turned off the input signal only sees an open circuit at the node. However, transistors in the off state are not perfect open circuits: they have small internal conductance and capacitance. The capacitance, known as parasitic capacitance, is of particular concern for signals that contain high frequency components, as the frequency keeps on increasing capacitance starts to acts like a short circuit rather than an open circuit as desired. As it becomes more of a short circuit, any internal resistance/conductance is now seen by the RF signal. But most detrimental is the attenuating resistor that was intended to be left floating is now seen through the signal path and incurs loss to the system. The insertion loss caused by the parasitic capacitance in series with internal and external resistance (attenuating) increases as the frequency increases. This insertion loss can be known as "de-Qing" the circuit, as it lowers the Q (gain) value. Additionally, the parasitic capacitance with the parallel resistance degrades phase imbalance increasingly as the signal frequency increases. For lower frequencies, these losses might be within acceptable ranges, and so can be ignored for some designs; however, for high frequency circuits, the de-Qing and phase imbalance can be an issue.

SUMMARY OF THE INVENTION

According to a first aspect of the present disclosure, a circuit is disclosed, comprising: a resistive element connected to an input terminal; a primary switching element in series with the resistive element; and a shunting switching element placed across the resistive element such that it would short current around the resistive element; wherein the shunting switching element is configured to be closed when the primary switching element is open, and the shunting switching element is configured to be open when the primary switching element is closed.

According to a second aspect of the present disclosure, a method of reducing de-Qing loss for a circuit, said circuit comprising a resistive element connected to an input signal and a primary switching element in series with the resistive element and a shunting switching element across the resistive element, is disclosed, the method comprising: opening the shunting switching element when the primary switching element is closed; and closing the shunting switching element when the primary switching element is open.

According to a third aspect of the present disclosure, a polyphase filter circuit comprising: parallel filter elements comprising a resistor and a capacitor; a primary switch in series with the resistor and the capacitor; and a shunting switch in parallel with the resistor and the capacitor, configured to short across the combination of the resistor and the capacitor when the shunting switch is closed.

According to a fourth aspect of the present disclosure, a method of fabricating switchable attenuation circuit with deQuing loss reduction is disclosed, the method comprising: providing a resistive element parallel to a signal input terminal; providing a primary switching element in series with the resistive element; and providing a shunting switching element placed across the resistive element such that it would short current around the resistive element; configuring the circuit such that the shunting switching element is closed when the primary switching element is open, and the shunting switching element is open when the primary switching element is closed.

The details of one or more embodiments of the invention are set forth in the accompanying drawings and the description below. Other features, objects, and advantages of the invention will be apparent from the description and drawings, and from the claims.

DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 2A shows an unbalanced pi attenuator pad, and FIG. 2B shows a balanced pi attenuator pad, or O pad.

Like reference numbers and designations in the various drawings indicate like elements.

DETAILED DESCRIPTION OF THE INVENTION

Figure 1:
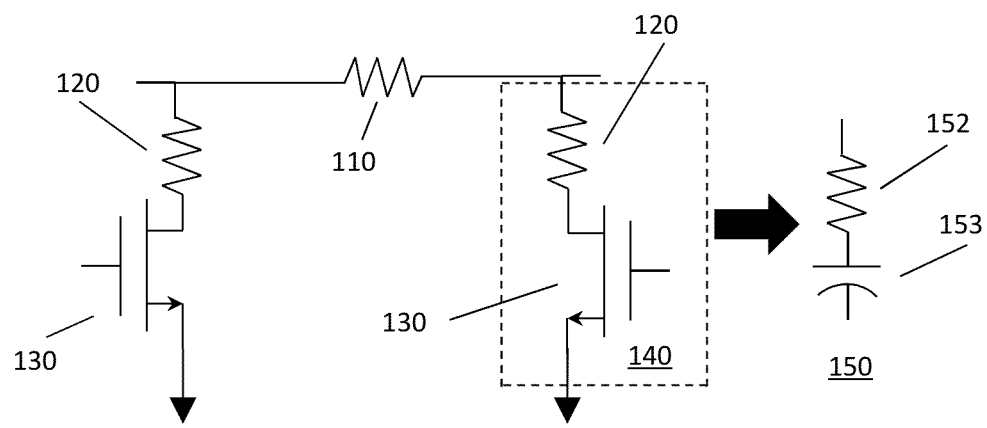
FIG. 1 shows a prior art switched pi attenuator pad.

FIG. 1 shows an example of a known pi (n) pad attenuator circuit, commonly used to reduce the level of a signal. A series resistance (110) of the circuit can be affected by switchable parallel resistances (120), which are controlled by switches (130) set in series with those resistances (120). These switches can be known as the "primary switches" or "resistors' switches". Because switches have an inherent capacitance, each leg (140) of the circuit, when that leg's switch (130) is turned off (i.e., put in reference mode), has an equivalent circuit (150) of a resistance (152) in series with a capacitor (153). Typically, the equivalent resistance (152) will be nearly equal to the parallel resistance (120) because the inherent resistance of the switch (130) is typically negligible. This has the effect of de-Qing the circuit at high frequencies—an increasing fraction of the alternating current ("AC") is lost. Also, a phase imbalance between is created from this unintentional filter element. A common implementation of a switch in a circuit is a single field-effect transistor (FET), although other switching means could be used. While a single FET is shown or discussed in the examples provided, one of ordinary skill would understand that a stack of FETs can be substituted for the single FET, thereby increasing power handling, linearity, and other factors without changing the basic nature of the invention.

Figure 2A:
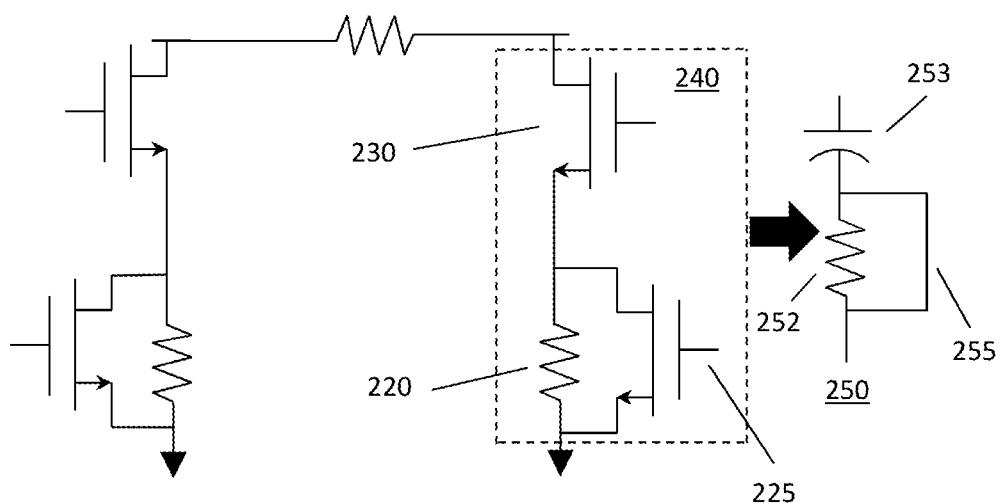
FIGS. 2A and 2B show an example of a switched pi attenuator pad with switch-shunted resistors.
Figure 2B:
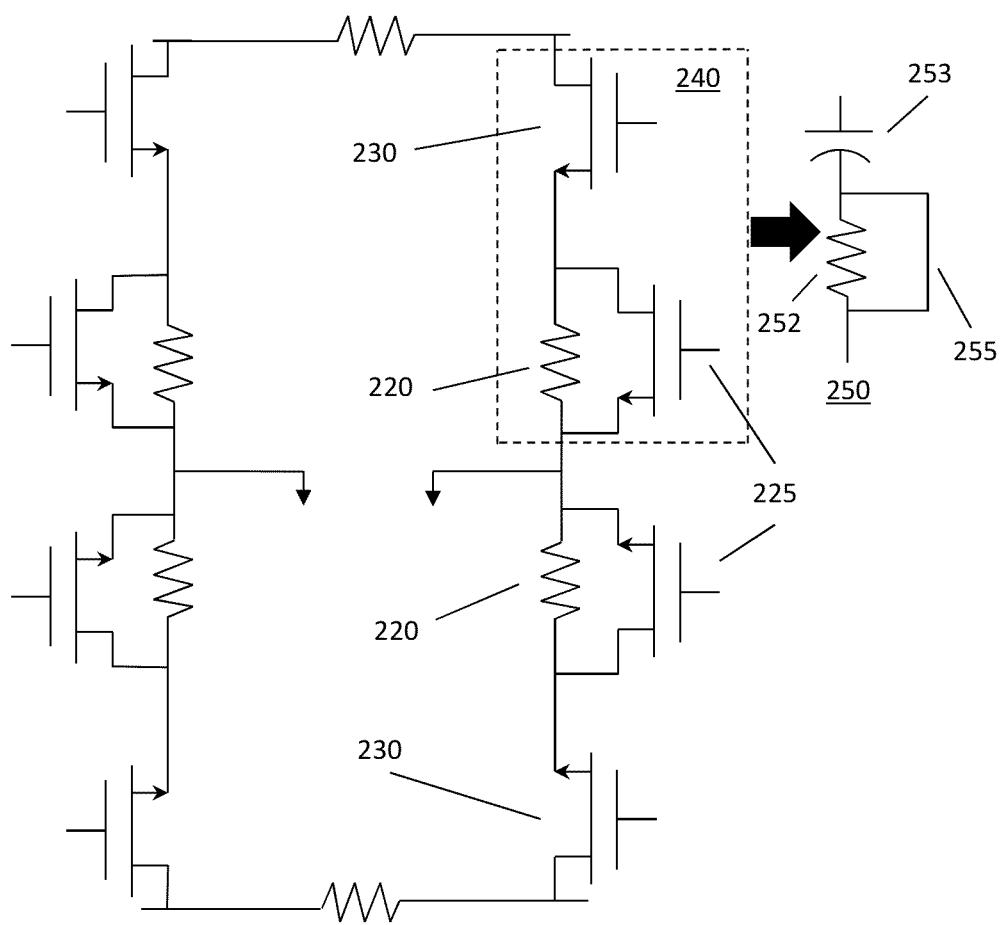

FIG. 2A shows an example of the pi pad attenuator circuit with switched resistance (the de-Qing loss reduction system) to alleviate de-Qing of the attenuator and reduce phase imbalance at higher frequencies. When the primary switch (230) of a leg is turned off (reference mode), another switch (225) in parallel with the leg resistance (220) is turned on, creating a short across the resistance (220). This other switch can be known as the "shunting switch". The equivalent circuit (250) of the leg (240) is a capacitance (253) from the primary switch (230) in series with a resistance (252) that has a short (255) across it. This creates an equivalent RC filter with almost no resistance. This reduces high frequency loss and phase imbalance when the attenuator is in reference mode. To return to attenuation mode, the primary switch (230) is turned on and the shunting switch (225) is turned off, making the equivalent circuit just a resistance to ground/low voltage. This reduces insertion loss in reference mode and acts as a phase balancer for the reference and attenuating path. It also improves the high frequency attenuation in the presence of ground inductance. The gate voltages of the shunting switches (225) of the two legs can be tied to the same voltage input to short across both parallel resistors (220) at the same time. The pi pad attenuator is an unbalanced attenuator: the same principle of a de-Qing loss reduction can be applied to the balanced form of the pi pad attenuator, the O pad attenuator, such as the split O pad attenuator shown in FIG. 2B. The use of resistor shunting improves both common mode and differential mode attenuation.

In one embodiment, the switches (225, 230) are MOSFET transistors, and the gate width (w) of shunting switch (225) is less than the w of the primary switch (230). For example, the w of the shunting switch (225) can be ¼$^{th}$ the w of the primary switch (230). In one embodiment, the switches (225, 230) have the same stack size. And this can be chosen to achieve the desired performance at a desired frequency.

The de-Qing loss reduction system can be applied to other attenuation circuits. Some, but not all, examples are provided herein. The system can also be applied to other circuits that switch resistances to achieve attenuation, filtering, or signal absorption and that would experience de-Qing at high frequencies. The application of the de-Qing loss reduction system works especially well in a CMOS integrated circuit, where the addition of a transistor is simplified.

Figure 3:
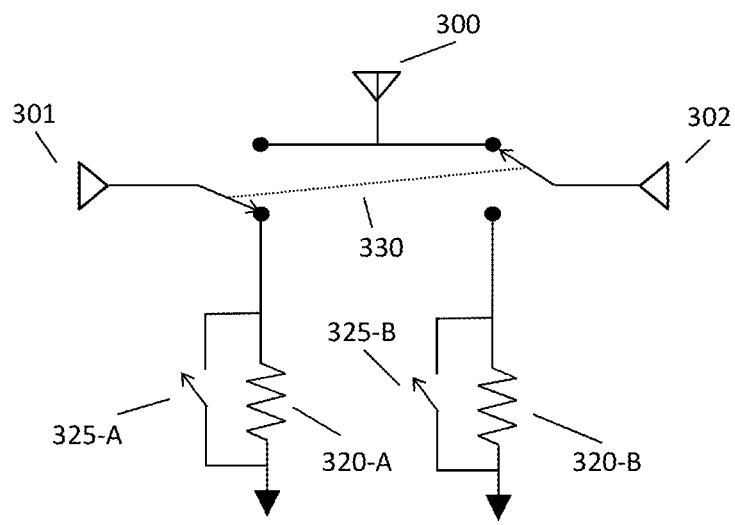
FIG. 3 shows an example of a single-pole multiple-throw absorptive switch with switch-shunted resistors.

FIG. 3 shows an example of the de-Qing loss reduction system a SPDT (single pole, double throw) RF (radio frequency) switch. The switch toggles between connecting a common RF port (300) to a first port (301) and a second port (302), and any power incident on the non-connected port gets absorbed through a resistor (320-A or 320-B). The connected-port resistor (320-B or 320-A) is then shorted out by a shunting switch 325-B or 325-A). For example, if the SPDT switch (330) connects the first port (301) to the common port (300) and connects the second port (302) to the resistor (320-B), then the corresponding shunting switch (325-B) will be off, allowing the second port (302) to see the resistance, and the other shunting switch (325-A) will be on, shorting across the unused resistor (320-A), thereby reducing de-Qing loss caused by the inherent capacitance of the open end of the SPDT switch acting as a short for high frequency signals, allowing power to be attenuated through the parallel resistance. The same principle would apply for a SPnT (single pole, multiple throw) circuit, or any combination of poles and throws for an absorptive switch circuit.

Figure 4:
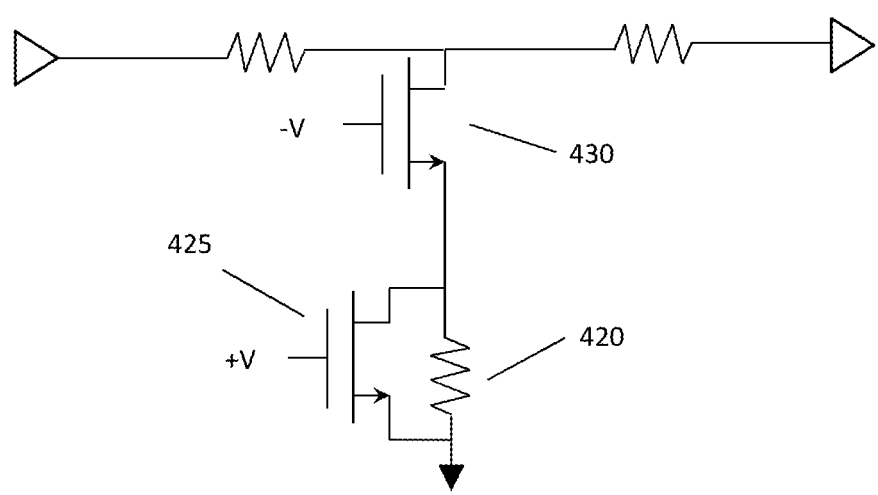
FIG. 4 shows an example of a switched tee attenuator pad with switch-shunted resistors.

FIG. 4 shows an example of the de-Qing loss reduction system a tee (T) pad attenuator circuit, which works on the same principle of shorting across the parallel resistance. Note that the gate voltage of the primary switch (430) is opposite that of the shunting switch (425), as their on and off state would be opposite of each other in operation.

Figure 5:
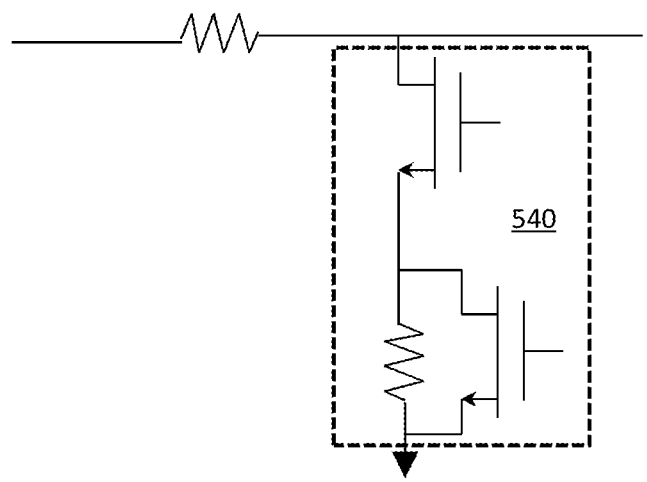
FIG. 5 shows an example of a switched L attenuator pad with switch-shunted resistors.

FIG. 5 shows an example of an L pad attenuator, which works on the same principle as the pi pad attenuator, but with only one leg (540).

Figure 6:
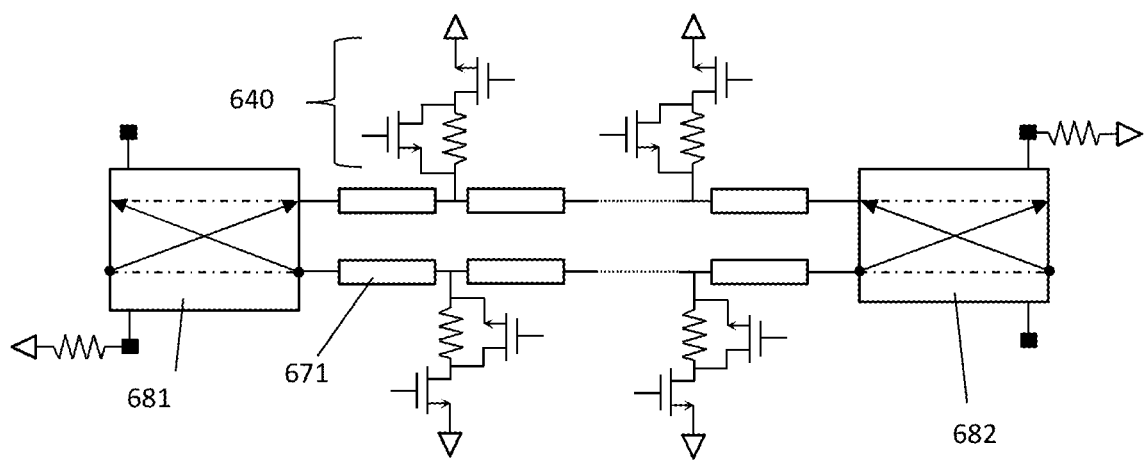
FIG. 6 shows an example of a switched balanced attenuator with switch-shunted resistors.

FIG. 6 shows an example of the de-Qing loss reduction system with a balanced attenuation circuit. The legs (640) can be placed between the resistive elements (671) that run between the quadrature couplers (681, 682).

Figure 7:
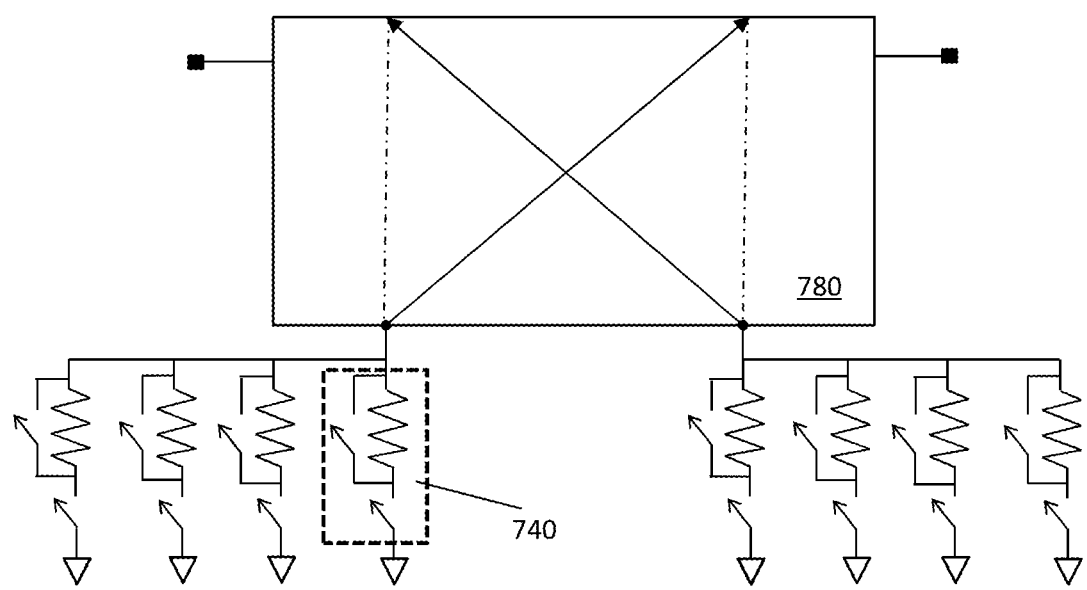
FIG. 7 shows an example of a switched reflection attenuator with switch-shunted resistors.

FIG. 7 shows an example of the de-Qing loss reduction system for a reflection attenuator. The legs (740) are connected to terminals of the quadrature coupler (780) to provide variable attenuation. It is noted that de-Qing loss is maximized by having multiple legs connected to the same terminal.

Figure 8:
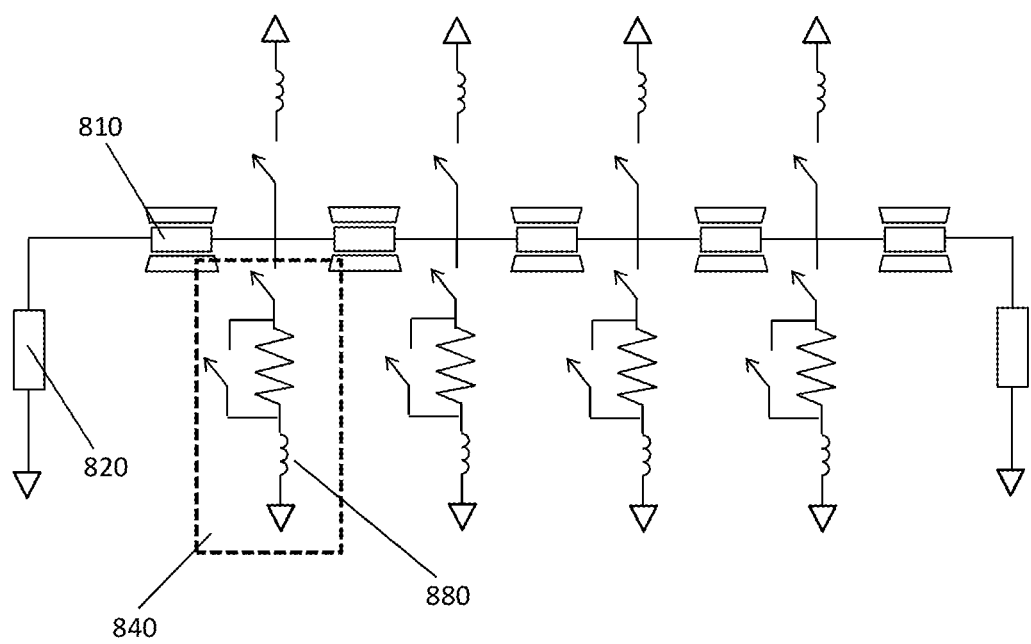
FIG. 8 shows an example of a distributed attenuator with switch-shunted resistors.

FIG. 8 shows an example of the de-Qing loss reduction system for a distributed attenuator. The legs (840) are added between coplanar waveguides (810) which conduct a signal between the end load elements (820), with an inductor (880) added to each leg. Coplanar waveguides (810) are shown as the transmission lines in this example, but other types of transmission lines can be used as well, such as microstrip or stripline.

Figure 9:
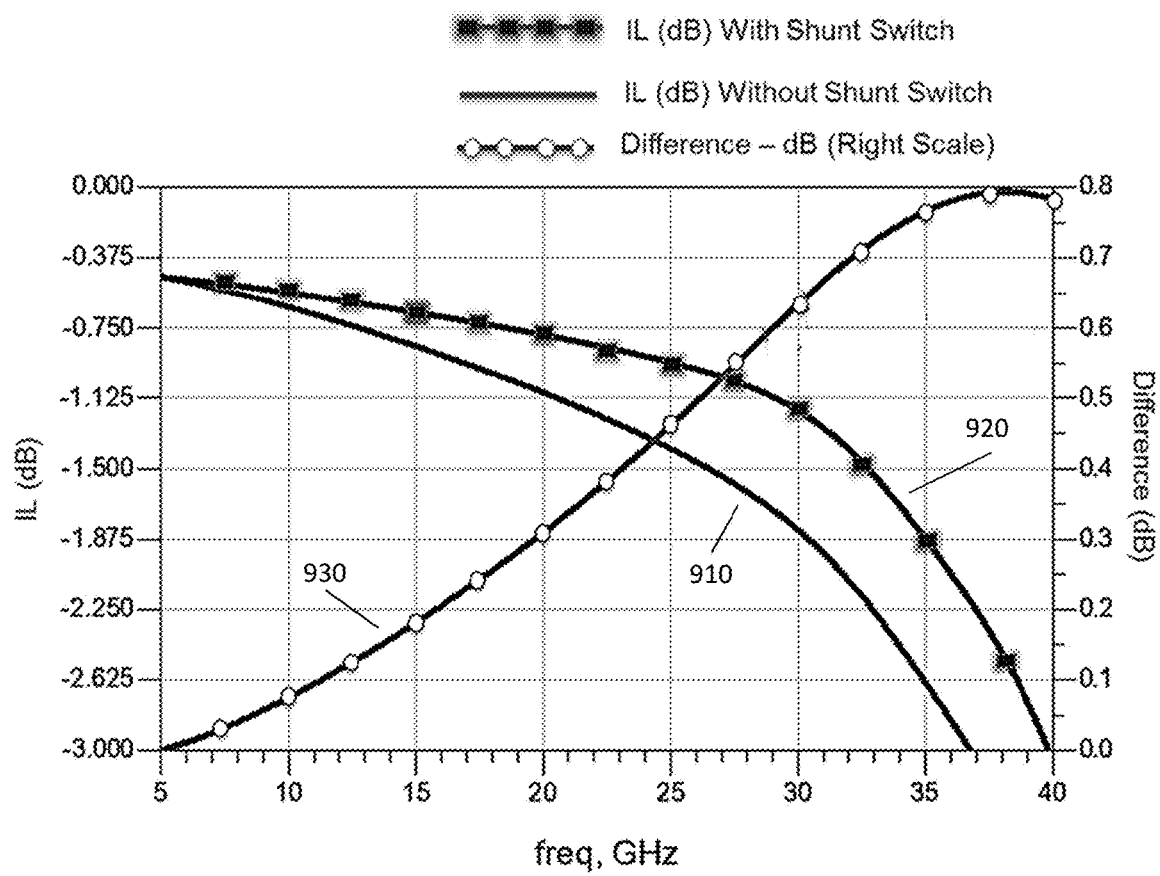
FIG. 9 shows an example graph comparing insertion loss between a distributed attenuator with and without switch-shunted resistors.

FIG. 9 shows an example graph of insertion loss (IL) versus signal frequency for the distributed attenuator of FIG. 8. The IL of the attenuator without using the switches for shunting across the resistance of the leg (the switch is left open in reference mode) is shown as a decreasing signal power as frequency increases (910). In comparison, the system utilizing the switches for shunting across the resistance is shown as decreasing at a lower rate (920). As the frequency increases, the difference (930) of IL between the two systems tends to increase, at least to a point.

Figure 10:
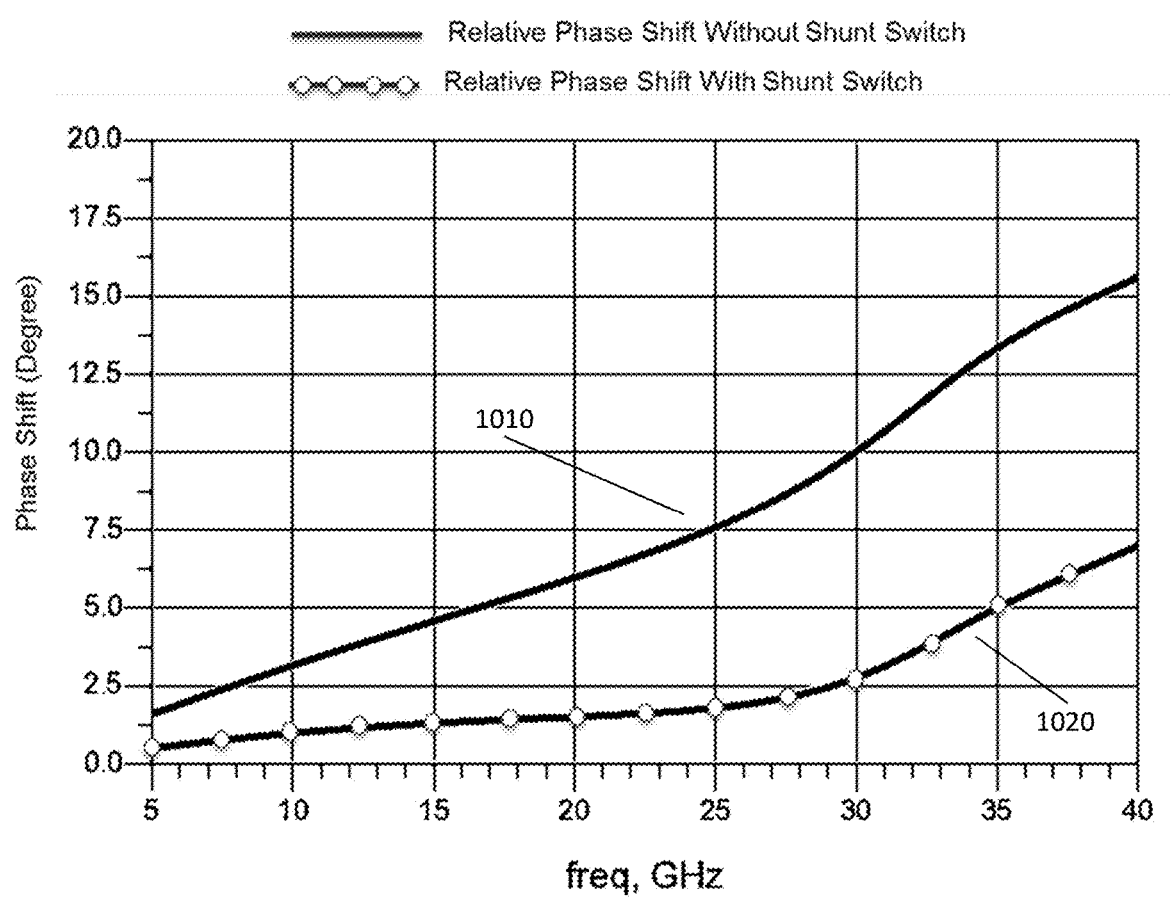
FIG. 10 shows an example graph comparing phase balancing between a distributed attenuator with and without switch-shunted resistors.

FIG. 10 shows an example graph of phase imbalance versus signal frequency for the distributed attenuator of FIG. 8. The phase shift of the attenuator without using the switches for shunting across the resistance (1010) increases as frequency increases. The phase shift of the system with the resistances shunted by the de-Qing loss reduction system (1020) increases at a markedly lower rate.

Figure 11:
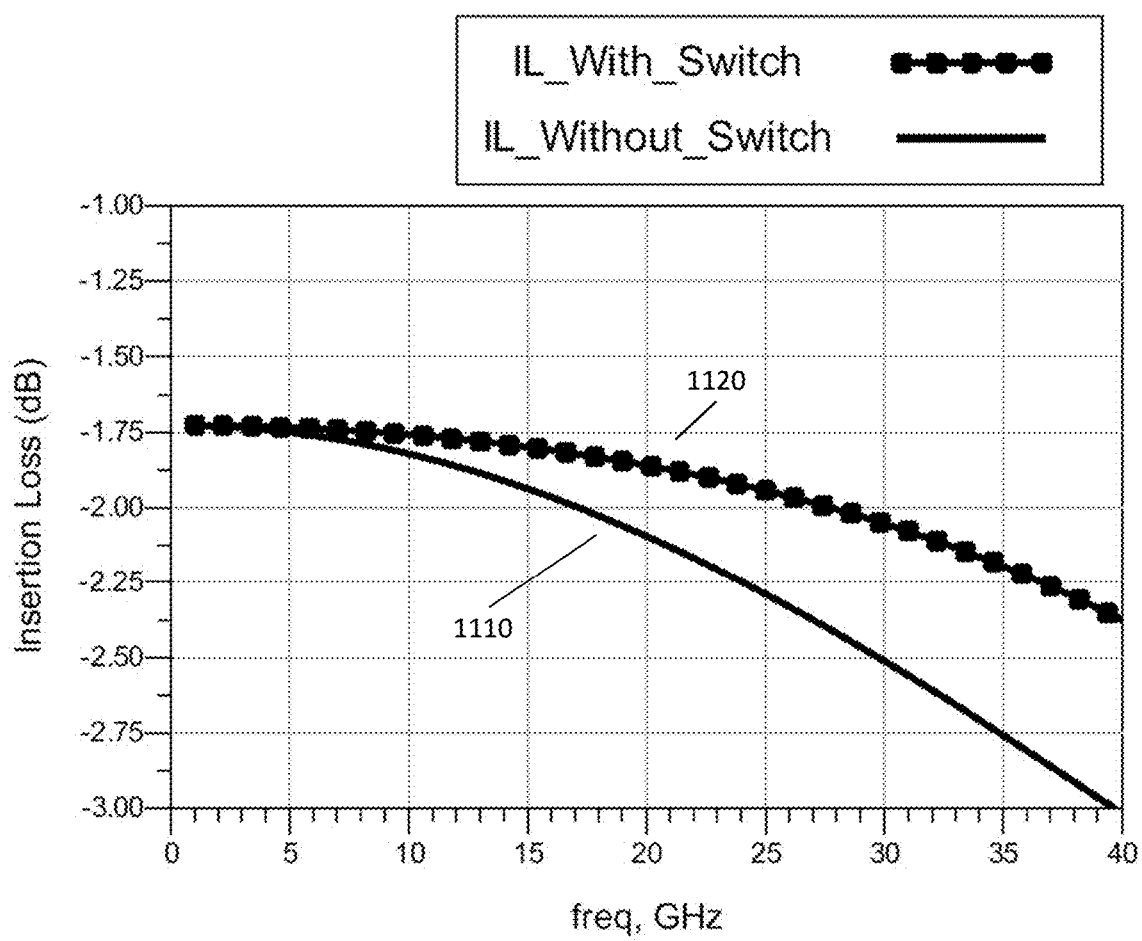
FIG. 11 shows an example graph comparing insertion loss of a conventional attenuator with and without switch-shunted resistors.
Figure 12:
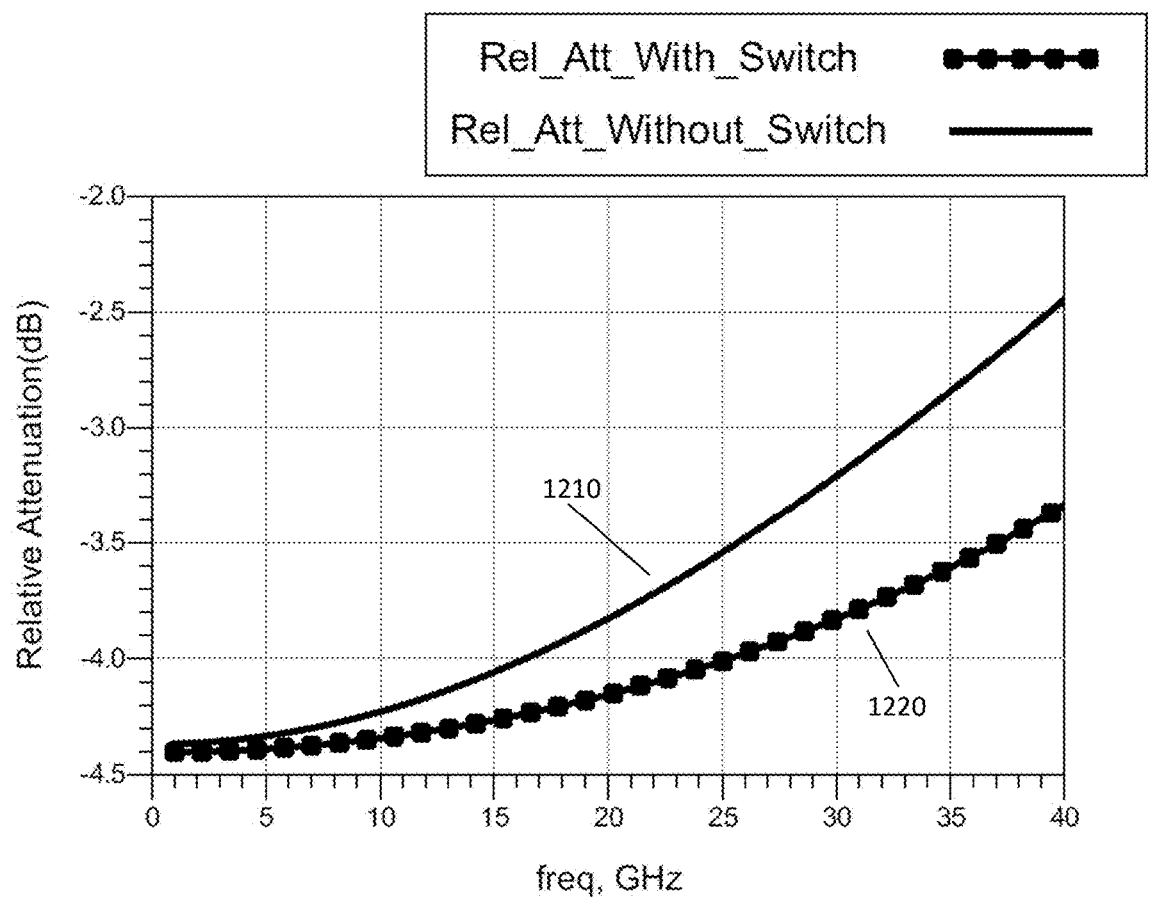
FIG. 12 shows an example graph comparing relative attenuation of a conventional attenuator with and without switch-shunted resistors.

FIG. 11 shows an example graph of insertion loss versus frequency for a conventional attenuator with resistance shunting (1120) and without resistance shunting (1110). It can be seen that the insertion loss is improved for the de-Qing loss reduction system. FIG. 12 shows an example graph of relative attenuation of the same conventional attenuator as used for FIG. 11. The relative attenuation for the attenuator without the shunting switch across the resistance (1210) increases at a faster rate than with the shunting switch (1220). As can be seen with a shunting switch configuration a desired 4 dB [+/–0.5 dB] performance is achieved up to 35 GHz, however the case without it only goes up to 25 GHz.

Figure 13A:
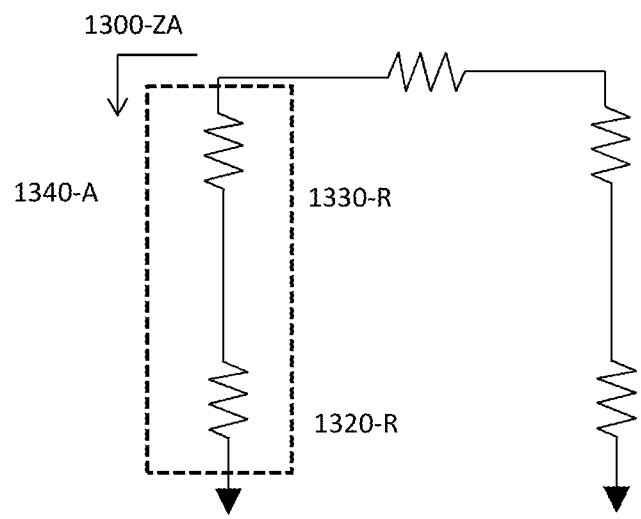
FIGS. 13A to 13D show RC circuit equivalents for a pi attenuation pad embodiment in attenuation mode and in reference mode, with and without the shunting switch.
Figure 13B:
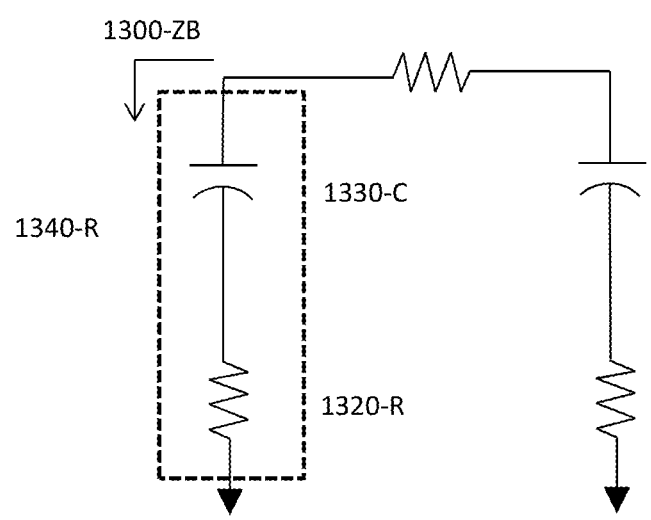
Figure 13C:
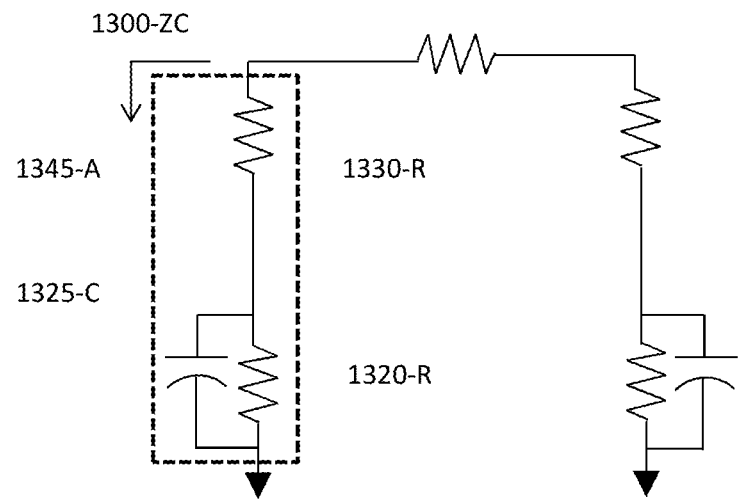
Figure 13D:
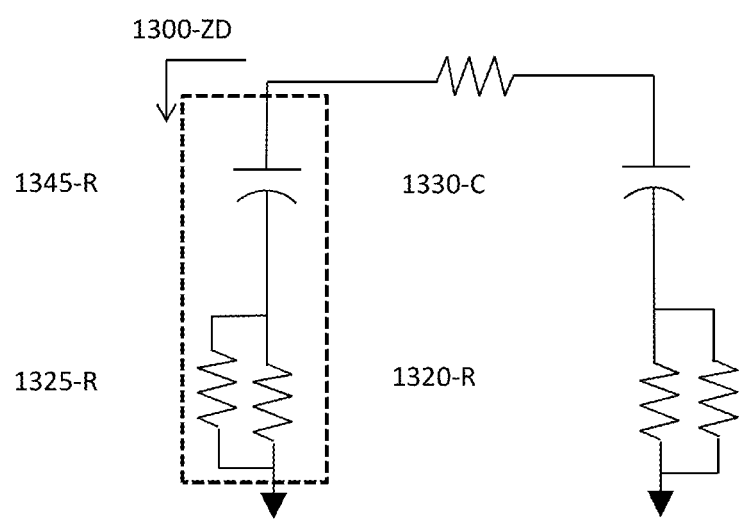

FIG. 13A shows an equivalent circuit diagram as the pi pad attenuation circuit without a de-Qing loss reduction shunting switch in attenuation mode. FIG. 13B shows an equivalent circuit diagram as the pi pad attenuation circuit without a de-Qing loss reduction shunting switch in reference mode. FIG. 13C shows an equivalent circuit diagram as the pi pad attenuation circuit of FIG. 2A with a de-Qing loss reduction shunting switch in attenuation mode. FIG. 13D shows an equivalent circuit diagram as the pi pad attenuation circuit with a de-Qing loss reduction shunting switch in reference mode, configured as shown in FIG. 2A. The input impedance ("Zin") (1300-ZA, 1300-ZB, 1300-ZC 1300-ZD) is considered for a leg (1340-A, 1340-R, 1345-A, 1345-R) of the circuit in each case.

For the non-shunted case in attenuation mode, the leg (1340-A) has a Zin (1300-ZA) is a function of the two equivalent resistances, the resistance of the primary switch in a closed state (1330-R) and the attenuating resistor (1320-R), as shown in FIG. 13A. In reference mode, the leg (1340-R) has a Zin (1300-ZB) as a function of the capacitance of the primary switch in an open state (1330-C) and the attenuating resistor (1320-R), as shown in FIG. 13B. Except for very low frequencies, a transition between these modes will cause a phase shift However, for the shunted resistance case, the phase shift caused by the transition between attenuation mode and reference mode can be greatly reduced. As shown in FIG. 13C, the Zin (1300-ZC) of the leg (1345-A) is a function of the resistance of the primary switch in a closed state (1330-R), the attenuating resistor (1320-R), and the capacitance of the shunting switch in an open state (1325-C). When transitioned to reference mode, the Zin (1300-ZD) of the leg (1345-R) is a function of the capacitance of the primary switch in an open state (1330-C), the attenuating resistor (1320-R), and the resistance of the shunting switch in a closed state (1325-R). With proper selection of shunting switch size, shunt arm impedance Zin in attenuating mode (1300-ZC) and reference mode (1300-ZD) can be made close to each other over a certain frequency range. This would reduce the phase shift caused when changing modes.

Figure 14:
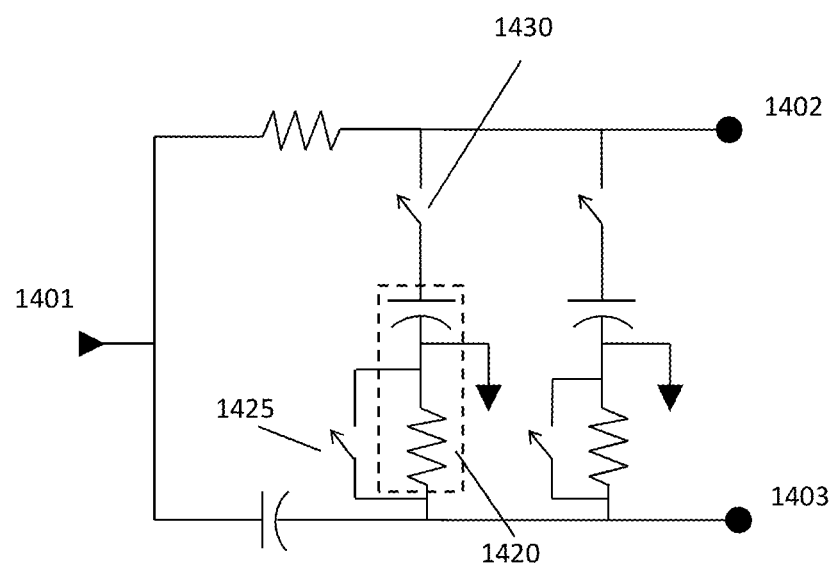
FIG. 14 shows an example of a switchable polyphaser filter with a switch-shunted RC element.

FIG. 14 shows an example of a polyphase filter. By proper choice of resistance and capacitance values for the circuit, the outputs (1402, 1403) can become a phase offsetted value of the input (1401) signal.

Figure 15:
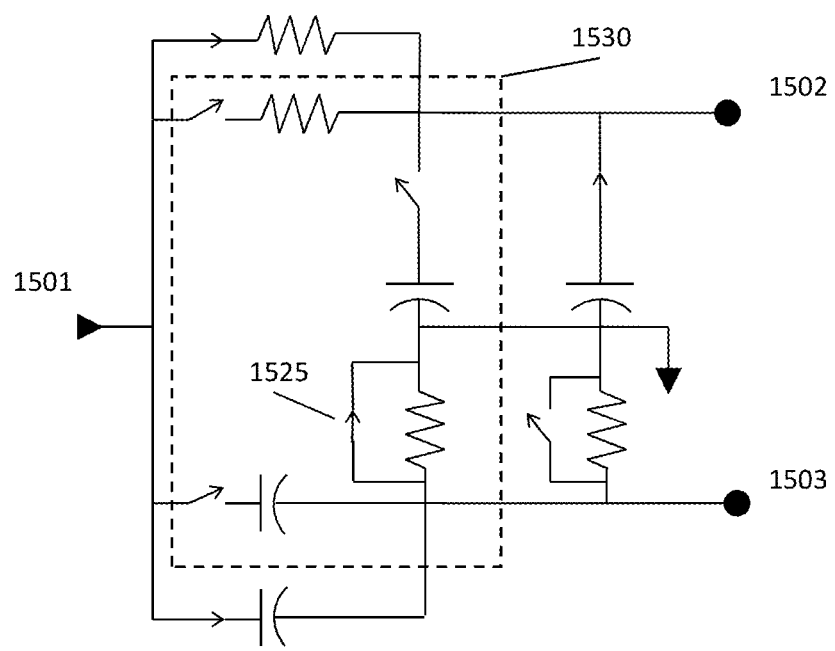
FIG. 15 shows a second example of a switchable polyphaser filter with a switch-shunted RC component.

FIG. 15 shows an example of a tunable polyphase filter where the RC values of the filter can be arbitrarily selected through switches, allowing for different phase offsetting. One RC component (internal to the region 1530) is shunted (1525) while turned off to reduce the deQing loss, and poly phase filtering is done by the other RC component (external to the region 1530). This is just one embodiment of the filter: the presented idea should be valid to any filtering system where switched resistance is used to change the filter characteristic.

Fabrication Technologies and Options

The term "switch" herein includes any technology that has an electronically (or optically) controllable resistance which can toggle between an open (very high resistance) state to a closed (very low resistance) state in a very short period of time, which exhibits a capacitance in the open state. This function can be performed by a mechanical switch, a transistor (such as a MOSFET or MESFET), or a small mechanical switch (such as a microelectromechanical systems (MEMS) switch).

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). De-spite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low by careful design.

Voltage levels may be adjusted or voltage and/or logic signal polarities reversed de-pending on a particular specification and/or implementing technology (e.g., NMOS, PMOS, or CMOS, and enhancement mode or depletion mode transistor devices). Component voltage, current, and power handling capabilities may be adapted as needed, for example, by adjusting de-vice sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A circuit comprising:
   a resistive element;
   a primary switching element in series with the resistive element; and
   a shunting switching element placed across the resistive element such that it would short current around the resistive element, wherein the shunting switching element is configured such that shunt arm impedance in attenuating mode is phase balanced with shunt arm impedance in reference mode over a selected frequency range;
   wherein the shunting switching element is configured to be closed when the primary switching element is open, and the shunting switching element is configured to be open when the primary switching element is closed.

2. The circuit of claim 1, wherein the resistive element, the primary switching element, and the shunting switching element are within a leg of an attenuation circuit.

3. The circuit of claim 2, wherein the attenuation circuit is a pi pad attenuator, an L pad attenuator, or an O pad attenuator.

4. The circuit of claim 2, wherein the attenuation circuit is a tee pad attenuator.

5. The circuit of claim 2, wherein the attenuation circuit is a distributed attenuator.

6. The circuit of claim 2, wherein the attenuation circuit is a balanced attenuator.

7. The circuit of claim 2, wherein the attenuation circuit is a reflection attenuator.

8. The circuit of claim 1, wherein the resistive element, the primary switching element, and the shunting switching element are within a leg of a single pole, multiple throw absorptive switch.

9. The circuit of claim 8, wherein the single pole, multiple throw absorptive switch is a single pole, double throw absorptive switch.

10. The circuit of claim 1, wherein the primary switching element and the shunting switching element are MOSFETs, each having a gate width.

11. The circuit of claim 10, wherein the gate width of the primary switching element is larger than the gate width of the shunting switching element.

12. The circuit of claim 11, wherein the gate width of the primary switching element is at least four times larger than the gate width of the shunting switching element.

13. A method of reducing de-Qing loss for a circuit, said circuit comprising a resistive element and a primary switching element in series with the resistive element and a shunting switching element across the resistive element wherein the shunting switching element is configured such that shunt arm impedance in attenuating mode is phase balanced with shunt arm impedance in reference mode over a selected frequency range, the method comprising:
   opening the shunting switching element when the primary switching element is closed; and
   closing the shunting switching element when the primary switching element is open.

14. The method of claim 13, wherein the resistive element, the primary switching element, and the shunting switching element are within a leg of an attenuation circuit.

15. The method of claim 14, wherein the attenuation circuit is a pi pad attenuator, an L pad attenuator, an O pad attenuator, or a tee pad attenuator.

16. The method of claim 14, wherein the attenuation circuit is a distributed attenuator.

17. The method of claim 14, wherein the attenuation circuit is a balanced attenuator.

18. The method of claim 14, wherein the attenuation circuit is a reflection attenuator.

19. The method of claim 13, wherein the resistive element, the primary switching element, and the shunting switching element are within a leg of a single pole, multiple throw absorptive switch.

20. The method of claim 19, wherein the single pole, multiple throw absorptive switch is a single pole, double throw absorptive switch.

21. A polyphase filter circuit comprising:
   parallel filter elements comprising a resistor and a capacitor;
   a primary switch in series with the resistor and the capacitor; and
   a shunting switch in parallel with the resistor and the capacitor, configured to short across the combination of the resistor and the capacitor when the shunting switch is closed.

22. The polyphase filter circuit of claim 21, wherein the polyphase filter circuit is a switchable polyphase filter adapted to achieve different phase offsetting.

23. A method of fabricating switchable attenuation circuit with de-Qing loss reduction, the method comprising:
   providing a resistive element;
   providing a primary switching element in series with the resistive element; and
   providing a shunting switching element placed across the resistive element such that it would short current around the resistive element, wherein the shunting switching element is selected such that shunt arm impedance in attenuating mode is phase balanced with shunt arm impedance in reference mode over a selected frequency range;
   configuring the circuit such that the shunting switching element is closed when the primary switching element is open, and the shunting switching element is open when the primary switching element is closed.

24. The polyphase filter circuit of claim 21, wherein the shunting switching element is selected such that shunt arm impedance in attenuating mode is phase balanced with shunt arm impedance in reference mode over a selected frequency range.

* * * * *